(12) United States Patent
Lin et al.

(10) Patent No.: US 12,131,776 B2
(45) Date of Patent: Oct. 29, 2024

(54) NON-VOLATILE MEMORY BASED COMPUTE-IN-MEMORY CELL

(71) Applicant: Taiwan Semiconductor Manufacturing Company, Ltd., Hsinchu (TW)

(72) Inventors: Zheng-Jun Lin, Taichung (TW); Chin-I Su, Hsinchu (TW); Chung-Cheng Chou, Hsinchu (TW); Chia-Fu Lee, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 94 days.

(21) Appl. No.: 17/695,578

(22) Filed: Mar. 15, 2022

(65) Prior Publication Data

US 2023/0162785 A1 May 25, 2023

Related U.S. Application Data

(60) Provisional application No. 63/282,768, filed on Nov. 24, 2021.

(51) Int. Cl.
*G11C 14/00* (2006.01)
*G11C 11/412* (2006.01)
*G11C 11/419* (2006.01)
*H03K 19/20* (2006.01)
(Continued)

(52) U.S. Cl.
CPC .......... *G11C 11/419* (2013.01); *G11C 11/412* (2013.01); *G11C 14/009* (2013.01); *H03K 19/20* (2013.01); *G11C 13/0026* (2013.01); *H03K 19/21* (2013.01)

(58) Field of Classification Search
CPC ............ G11C 14/0054; G11C 14/0072; G11C 14/0081; G11C 14/009; G11C 11/41; G11C 11/412; G11C 11/418; G11C 11/419; G11C 13/00; G11C 13/0002
See application file for complete search history.

(56) References Cited

U.S. PATENT DOCUMENTS

| 7,099,189 B1 | 8/2006 | Plants |
| 9,368,208 B1* | 6/2016 | Marshall ............ G11C 14/0081 |
| 2020/0126619 A1* | 4/2020 | Jaiswal .................. G11C 5/147 |

FOREIGN PATENT DOCUMENTS

| TW | I492233 B | 7/2015 |
| WO | 2012/009179 A1 | 1/2012 |

OTHER PUBLICATIONS

Taiwan Office Action for Application No. 111131656 mailed Dec. 13, 2023.

* cited by examiner

*Primary Examiner* — Alfredo Bermudez Lozada
(74) *Attorney, Agent, or Firm* — MERCHANT & GOULD P.C.

(57) ABSTRACT

A memory device including a static random-access memory that includes two cross-coupled inverters and an access transistor having a gate connected to a word line. The memory device further includes one or more logic gates electrically coupled to the static random-access memory, and a non-volatile memory electrically coupled to the static random-access memory and configured to store data and be read using the static random-access memory, wherein the non-volatile memory is connected on one side to the access transistor and on another side to the two cross-coupled inverters.

20 Claims, 11 Drawing Sheets

(51) Int. Cl.
*G11C 13/00* (2006.01)
*H03K 19/21* (2006.01)

| CIM mode (AND) | IN | D | OUT | Note |
|---|---|---|---|---|
| | 0 | 0 | 0 | BL=BLB=WL =WLB=0 |
| | 0 | 1 | 0 | |
| | 1 | 0 | 0 | |
| | 1 | 1 | 1 | |
| CIM mode (OR) | IN | D | OUT | Note |
| | 0 | 0 | 0 | BL=BLB=WL =WLB=0 |
| | 0 | 1 | 1 | |
| | 1 | 0 | 1 | |
| | 1 | 1 | 1 | |

FIG. 10

| SRAM Read mode | BL | BLB | WL | WLB |
|---|---|---|---|---|
| Read 0 (302) | 1→0 | 1 | 1 | 1 |
| Read 1 (304) | 1 | 1→0 | 1 | 1 |

FIG. 11

| SRAM Write mode | BL | BLB | WL | WLB |
|---|---|---|---|---|
| Write 0 (312) | 0 | 1 | 1 | 1 |
| Write 1 (314) | 1 | 0 | 1 | 1 |

FIG. 12

| RRAM(Store) Write mode | BL | BLB | WL | WLB |
|---|---|---|---|---|
| SET (VDD1=VSET) | 0 | 0 | 1(WL=VWWL) | 1(WLB=PWR) |
| RESET (VBL=VRESET) | 1 | 1 | 1(WL=VWWL) | 1(WLB=PWR) |

FIG. 13

| RRAM Recall mode | BL | BLB | WL | WLB |
|---|---|---|---|---|
| Initialized write D=0 | 0 | 1 | 1 | 1 |
| Recall SET(low R),D→1 RESET(high R),D→0 | 1 | 0 | 1 | 0 |

FIG. 14

NON-VOLATILE MEMORY BASED COMPUTE-IN-MEMORY CELL

CROSS REFERENCE TO RELATED APPLICATION

This application claims the benefit of U.S. Provisional Patent Application No. 63/282,768, filed on Nov. 24, 2021, the contents of which is incorporated by reference.

BACKGROUND

Typically, compute-in-memory (CIM) systems store information in random-access memory (RAM), such as static random-access memory (SRAM), and perform calculations at the memory device level. In CIM systems, data is accessed more quickly from the RAM than from other storage devices, such that the data can be analyzed more quickly. This enables faster reporting and decision-making in business and machine learning applications.

An SRAM has an array of memory cells that include transistors connected between an upper reference potential and a lower reference potential, such that one of two storage nodes stores information to be stored and the other storage node stores the complementary information. One SRAM memory cell arrangement includes six transistors, where each bit of information is stored on four of the transistors that form two cross-coupled inverters. The other two transistors are connected to the memory cell word lines to control access to the two cross-coupled inverters during read and write operations by selectively connecting the memory cell to a bit line BL and a complementary bit line or bit line bar BLB. Since SRAM is volatile memory, data is lost when power is removed from the SRAM.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion. In addition, the drawings are illustrative as examples of embodiments of the disclosure and are not intended to be limiting.

FIG. 10 is a diagram schematically illustrating two example truth tables for CIM logic gates operating in the CIM mode, in accordance with some embodiments.

FIG. 11 is a diagram schematically illustrating a table depicting a read operation of the SRAM in one of the NVM SRAM CIM cells operating in the SRAM mode, in accordance with some embodiments.

FIG. 12 is a diagram schematically illustrating a table depicting a write operation of the SRAM in one of the NVM SRAM CIM cells operating in the SRAM mode, in accordance with some embodiments.

FIG. 13 is a diagram schematically illustrating a table depicting write operations including a set operation (write logic 1) and a reset operation (write logic 0) for an RRAM, in accordance with some embodiments.

FIG. 14 is a diagram schematically illustrating a table depicting a recall operation of stored data from the RRAM, in accordance with some embodiments.

DETAILED DESCRIPTION

Figure 1:
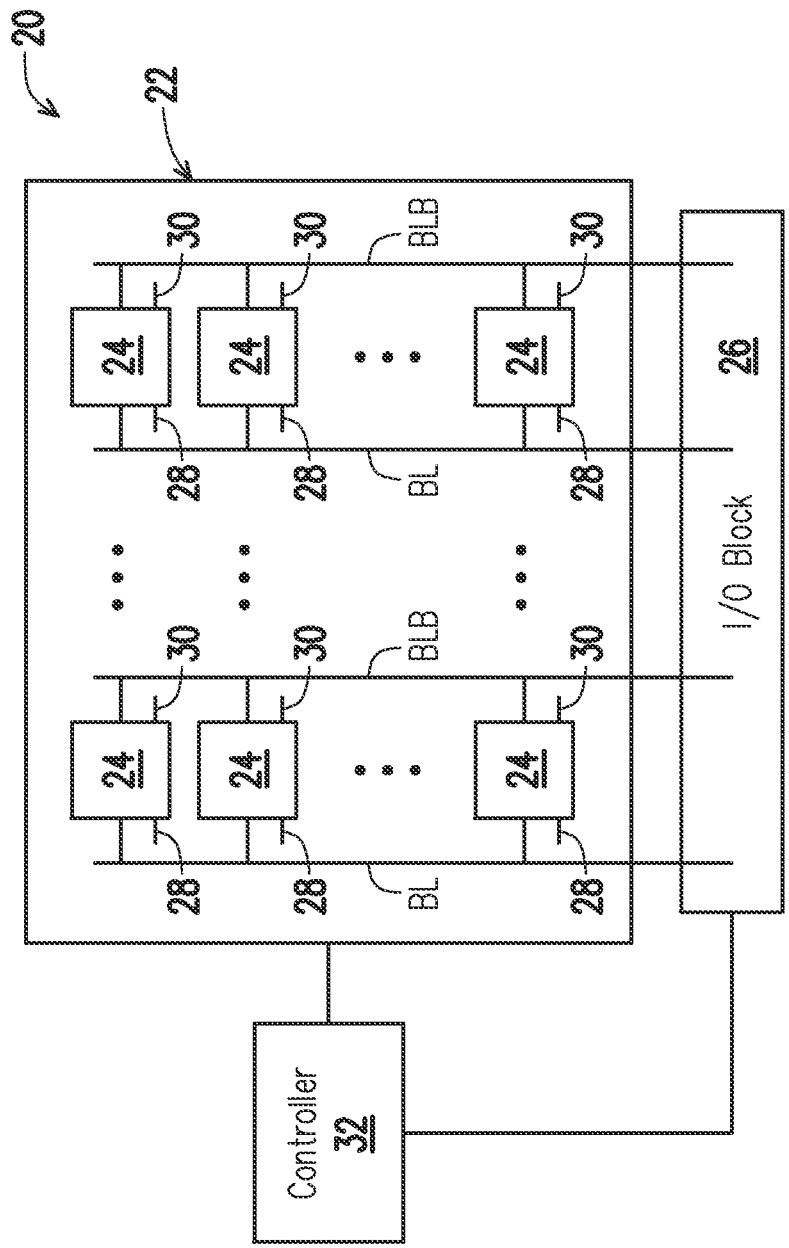
FIG. 1 is a block diagram schematically illustrating a memory device, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In some CIM systems, an SRAM CIM cell includes an SRAM electrically connected to CIM logic gates. The SRAM is a volatile memory, such that data in the SRAM is lost when the SRAM CIM cell is powered down. To recall data, the SRAM CIM cell retrieves data from a distant memory, such as a separate memory array or another computer. Recalling the data uses a large amount of power in transitioning the data from the distant memory to the SRAM CIM cell.

Disclosed embodiments include a non-volatile memory (NVM) integrated into an SRAM CIM cell. The resulting NVM SRAM CIM cell is configured to store data in the NVM and recall data from the NVM in the NVM SRAM CIM cell. Storing data in the NVM, as opposed to in the SRAM or in a distant memory cell, reduces standby power for storing the data and supports retaining the data during power down, when the NVM SRAM CIM cell is powered completely off. Recalling data from the NVM reduces power consumption for acquiring the data, since the data is not transferred from a distant memory cell. Also, using data stored in the SRAM for CIM operations improves performance of the CIM logic operations, where the NVM SRAM CIM cell does logic operations on data from the SRAM to achieve high speed digital based CIM functions without utilizing a complicated sensing and reading scheme. In addition, including the NVM SRAM CIM cell in an integrated circuit reduces area overhead where the SRAM is combined with a back-end memory process and less area is used for recalling data and data transition circuitry. In some embodiments, the NVM SRAM CIM cell includes a six transistor SRAM and one NVM, such as a resistive random-access memory (RRAM).

In disclosed embodiments, the NVM SRAM CIM cell includes three basic building blocks. One part of the NVM SRAM CIM cell is an SRAM, such as a six transistor SRAM. Another part of the NVM SRAM CIM cell is an NVM that is configured to store data. A third part of the NVM SRAM CIM cell includes logic gates for performing CIM operations. In some embodiments, the NVM is an RRAM. In other embodiments, the NVM is a magneto-resistive random-access memory (MRAM), a ferroelectric random-access memory (FRAM), and/or a phase-change random-access memory (PCRAM).

Also, in disclosed embodiments, the NVM SRAM CIM cell is configured to operate in an SRAM mode, an NVM mode, and in a CIM mode. In the SRAM mode, data is written into and read from the SRAM in the NVM SRAM CIM cell. In the NVM mode, the NVM can be set, i.e., written to a 1, reset, i.e., written to a 0, and data can be recalled from the NVM using the SRAM. In the CIM mode, logic gates receive one or more input signals and data from the SRAM to calculate a CIM output.

FIG. 1 is a block diagram schematically illustrating a memory device 20, in accordance with some embodiments. The memory device 20 includes a memory array 22 that includes a plurality of memory cells 24 arranged in rows and columns. Each of the rows has a corresponding first word line WL and a corresponding second word line WLB (not shown in FIG. 1), and each of the columns has a corresponding bit line BL and a corresponding complementary bit line or bit line bar BLB. Each memory cell 24 of the plurality of memory cells 24 is electrically coupled to the first word line WL and the second word line WLB of the row of the memory cell 24 and to the corresponding bit line BL and the bit line bar BLB of the column of the memory cell 24. The bit lines BLs and the bit line bars BLBs are electrically connected to an input/output (I/O) block 26 that is configured to read data signals from and provide data signals to the plurality of memory cells 24.

The plurality of memory cells 24 are NVM SRAM CIM cells. Each of the NVM SRAM CIM cells includes an SRAM, such as a six transistor SRAM, an NVM configured to store data, and CIM logic gates for performing CIM operations. The NVM is integrated into the SRAM and the SRAM is electrically connected to the CIM logic gates. The CIM logic gates of each of the plurality of memory cells 24 include an input 28 for receiving an input signal and an output 30 for providing a CIM output from CIM operations.

The resulting NVM SRAM CIM cell is configured to operate in three modes, including an SRAM mode, an NVM mode, and a CIM mode. In the SRAM mode, data is written into and read from the SRAM. In the NVM mode, the NVM can be set, i.e., written to a 1, reset, i.e., written to a 0, and data can be recalled from the NVM using the SRAM. In the CIM mode, the logic gates receive one or more input signals at the input 28 and data from the SRAM and determine a CIM output that is provided at the output 30.

A memory control circuit or controller 32 is electrically connected to the memory array 22 and to the I/O block 26 and configured to control operation of the memory device 20. The controller 32 receives signals such as clock signals, command signals, and address signals for accessing and controlling operation of the memory device 20, including operation of the plurality of memory cells 24, i.e., the NVM SRAM CIM cells, in the memory array 22. For example, address signals may be received and decoded into row and column addresses for accessing memory cells 24 of the memory array 22. Also, the controller 32 is configured to control the application of signals to the first word lines WLs, the second word lines WLBs, the bit lines BLs, the bit line bars BLBs, the input signals at the inputs 28, and to power supply lines of the memory cells 24 and the memory device 20.

In some embodiments, the controller 32 includes one or more processors. In some embodiments, the controller 32 includes one or more processors and memory configured to store code that is executed by the one or more processors to perform the functions of the memory device 20. In some embodiments, the controller 32 includes hardware, such as logic, configured to receive addresses and commands and perform the functions of the memory device 20. In some embodiments, the controller includes hardware and/or firmware and/or software executed by the hardware for performing the functions of the memory device 20.

Figure 2:
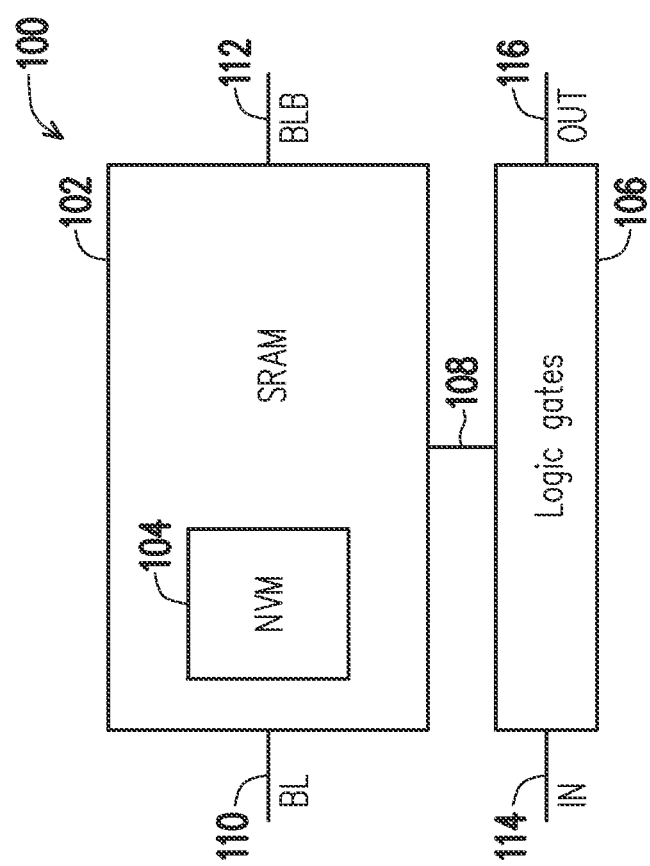
FIG. 2 is a block diagram schematically illustrating an NVM SRAM CIM cell, in accordance with some embodiments.

FIG. 2 is a block diagram schematically illustrating an NVM SRAM CIM cell 100, in accordance with some embodiments. The NVM SRAM CIM cell 100 is configured to be used in a memory device, such as the memory device 20 of FIG. 1. In some embodiments, the NVM SRAM CIM cell 100 is like the memory cell 24.

The NVM SRAM CIM cell 100 includes an SRAM 102, an NVM 104, and CIM logic gates 106. The NVM 104 is integrated (or connected) into the SRAM 102 and the SRAM 102 is electrically connected to the CIM logic gates 106 by communications path 108. The SRAM 102 is electrically connected to a bit line BL 110 and a complementary bit line or bit line bar BLB 112, such as a bit line BL and a bit line bar BLB of the memory device 20. Also, the SRAM 102 is electrically coupled to word lines, such as the first word line WL and the second word line WLB of the memory device 20. In some embodiments, the SRAM 102 is a six transistor SRAM. In other embodiments, the SRAM 102 is a different type of SRAM, such as an SRAM that has more or less than six transistors.

The NVM 104 is integrated (or connected) into the SRAM 102 and configured to store data. In some embodiments, the NVM 104 is an RRAM. In some embodiments, the NVM 104 is an MRAM. In some embodiments, the NVM 104 is an FRAM. In some embodiments, the NVM 104 is a PCRAM.

The CIM logic gates 106 are for performing CIM operations. The CIM logic gates 106 include an input 114 for receiving an input signal and an output 116 for providing a CIM output. The one or more logic gates 106 are configured to perform one or more logic functions, such as AND, OR, NOT, NAND, NOR, XOR, XNOR, and Buffer functions.

The resulting NVM SRAM CIM cell 100 is configured to operate in three modes, including an SRAM mode, an NVM mode, and a CIM mode. In the SRAM mode, data is written into and read from the SRAM 102. In the NVM mode, the NVM 104 can be set, i.e., written to a 1, reset, i.e., written to a 0, and data can be recalled from the NVM 104 using the SRAM 102. In the CIM mode, the logic gates 106 receive one or more input signals at the input 114 and data from the SRAM 102 and determine a CIM output that is provided at the output 116.

Figure 3:
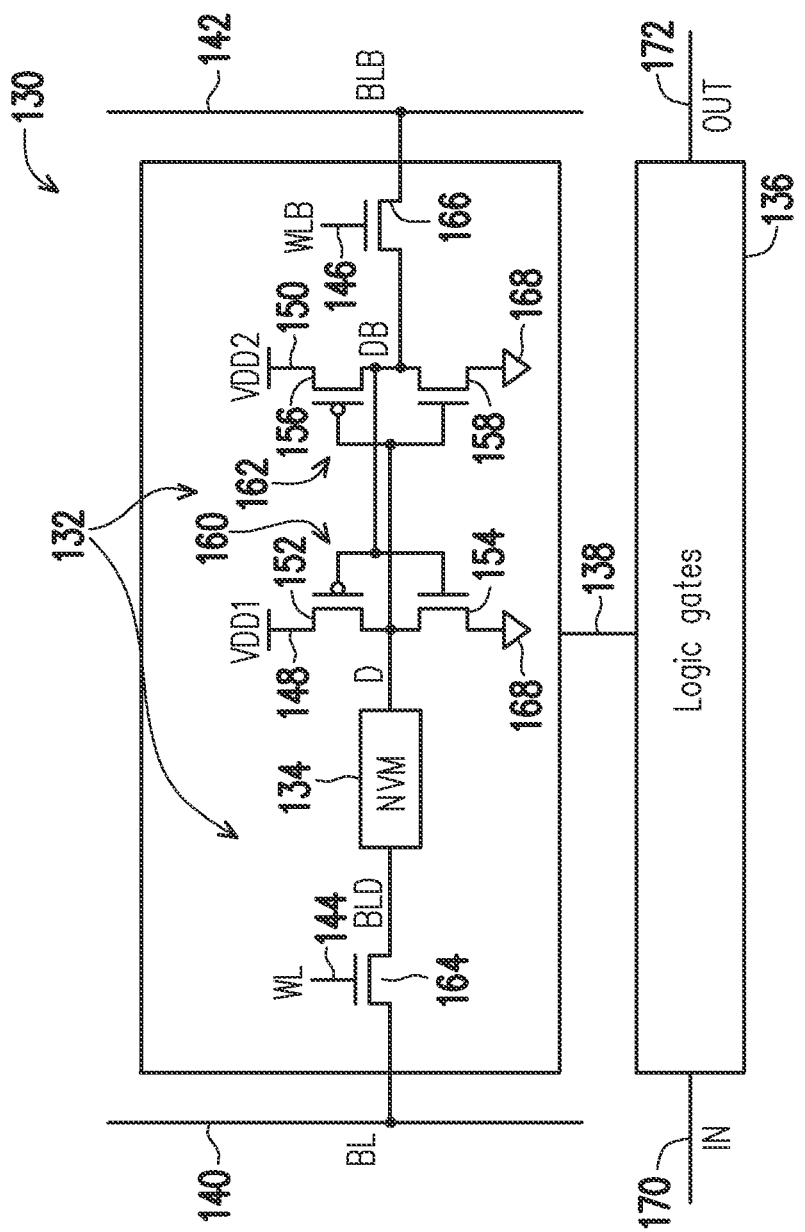
FIG. 3 is a diagram schematically illustrating an NVM SRAM CIM cell that includes a six transistor SRAM and an NVM that is integrated (or connected) into the six transistor SRAM, in accordance with some embodiments.

FIG. 3 is a diagram schematically illustrating an NVM SRAM CIM cell 130 that includes a six transistor SRAM 132 and an NVM 134 that is integrated (or connected) into the six transistor SRAM 132, in accordance with some embodiments. The NVM SRAM CIM cell 130 includes the SRAM 132, the NVM 134, and CIM logic gates 136. The NVM SRAM CIM cell 130 is configured to be used in a memory device, such as the memory device 20 of FIG. 1. In some embodiments, the NVM SRAM CIM cell 130 is like the memory cell 24 (shown in FIG. 1). In some embodiments, the NVM SRAM CIM cell 130 is like the NVM SRAM CIM cell 100 of FIG. 2.

The NVM 134 is integrated (or connected) into the SRAM 132 and the SRAM 132 is electrically connected to the CIM logic gates 136 by communications path 138. The SRAM 132 is electrically connected to a bit line BL 140 and a complementary bit line or bit line bar BLB 142, which may be like a bit line BL and a bit line bar BLB of the memory device 20. Also, the SRAM 132 is electrically coupled to a first word line 144 and a second word line WLB 146, which may be like a first word line WL and a second word line WLB of the memory device 20. In addition, the SRAM 132 is configured to receive a first power supply voltage VDD1 148 and a second power supply voltage VDD2 150.

The six transistor SRAM 132 includes four transistors 152, 154, 156, and 158 that form two cross-coupled inverters 160 and 162 configured to store one bit of information and two access control NMOS transistors 164 and 166 that control access to the two cross-coupled inverters 160 and 162.

The first inverter 160 includes first PMOS transistor 152 and first NMOS transistor 154. One drain/source region of the first PMOS transistor 152 is electrically connected to receive the first power supply voltage VDD1 148 and the other drain/source region of the first PMOS transistor 152 is electrically connected to a drain/source region of the first NMOS transistor 154, the gates of the transistors 156 and 158, and to one side of the NVM 134. The other drain/source region of the first NMOS transistor 154 is electrically connected to a reference 168, such as ground.

The second inverter 162 includes second PMOS transistor 156 and second NMOS transistor 158. One drain/source region of the second PMOS transistor 156 is electrically connected to receive the second power supply voltage VDD2 150 and the other drain/source region of the second PMOS transistor 156 is electrically connected to a drain/source region of the second NMOS transistor 158, the gates of the first PMOS transistor 152 and the first NMOS transistor 154, and to a drain/source region of the access control NMOS transistor 166. The other drain/source region of second NMOS transistor 158 is electrically connected to the reference 168, such as ground.

The access control NMOS transistors 164 and 166 are connected to control access to the two cross-coupled inverters 160 and 162 by selectively connecting the NVM SRAM CIM cell 130 to the bit line BL 140 and to the bit line bar BLB 142. One drain/source region of the first access control NMOS transistor 164 is electrically connected to one side of the NVM 134 and the other drain/source region of the first access control NMOS transistor 164 is electrically connected to the bit line BL 140. The gate of the first access control NMOS transistor 164 is electrically connected to the word line WL 144. Also, one drain/source region of the second access control NMOS transistor 166 is electrically connected to the drain/source region of the second PMOS transistor 156, the drain/source region of the second NMOS transistor 158, and the gates of the first PMOS transistor 152 and the first NMOS transistor 154. The other drain/source region of the second access control NMOS transistor 166 is electrically connected to the bit line bar BLB 142. The gate of the second access control NMOS transistor 166 is electrically connected to the second word line WLB 146.

A controller, such as controller 32 (shown in FIG. 1), provides signals to the first word line WL 144 and to the second word line WLB 146 to control access to the two cross-coupled inverters 160 and 162 by selectively connecting the NVM SRAM CIM cell 130 to the bit line BL 140 and the bit line bar BLB 142.

The NVM 134 is connected into the SRAM 132 and configured to store data. In some embodiments, the NVM 134 is an RRAM. In some embodiments, the NVM 134 is an MRAM. In some embodiments, the NVM 134 is an FRAM. In some embodiments, the NVM 134 is a PCRAM.

The CIM logic gates 136 are for performing CIM operations. The CIM logic gates 136 include an input 170 for receiving an input signal IN and an output 172 for providing a CIM output OUT. The CIM logic gates 136 are configured to perform one or more logic functions, such as AND, OR, NOT, NAND, NOR, XOR, XNOR, and Buffer functions.

The resulting NVM SRAM CIM cell 130 is configured to operate in three modes, including an SRAM mode, an NVM mode, and a CIM mode. In the SRAM mode, data is written into and read from the six transistor SRAM 132. In the NVM mode, the NVM 134 can be set, i.e., written to a 1, reset, i.e., written to a 0, and data can be recalled from the NVM 134 using the SRAM 132. In the CIM mode, the logic gates 136 receive one or more input signals IN at the input 170 and data from the SRAM 132 to determine a CIM output OUT that is provided at the output 172.

Figure 4:
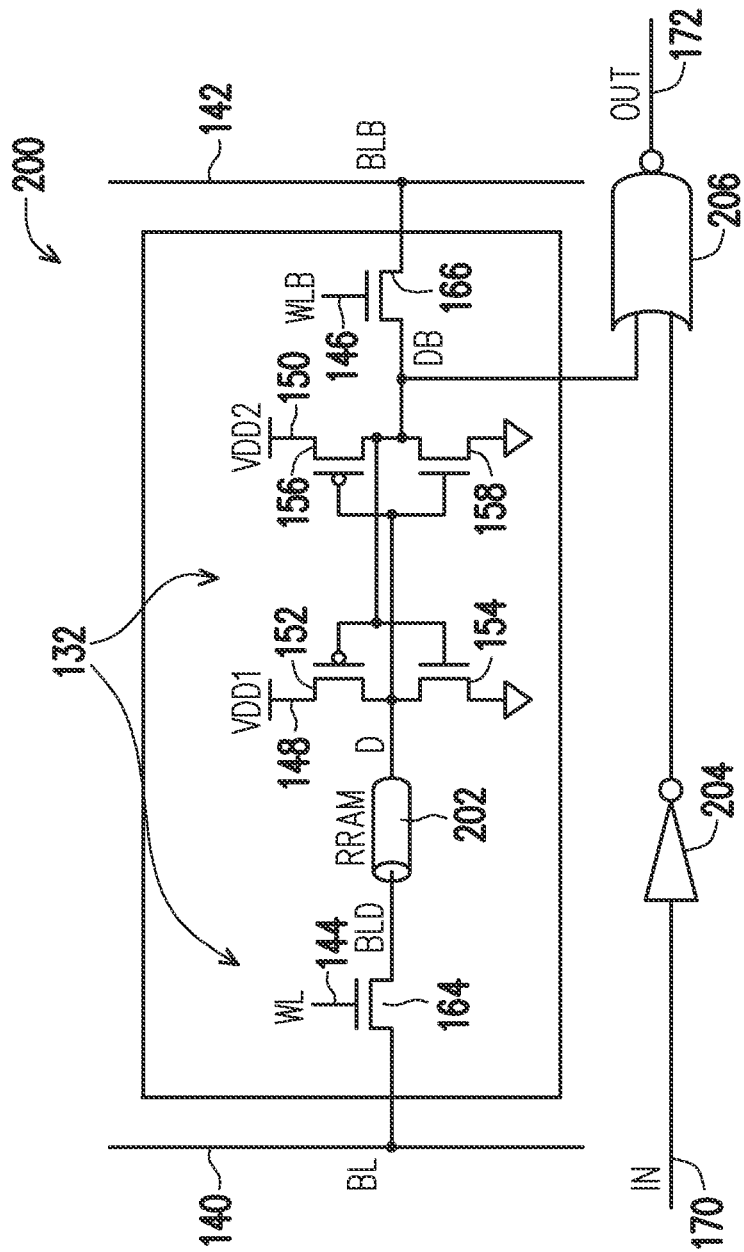
FIG. 4 is a diagram schematically illustrating an NVM SRAM CIM cell that includes an RRAM for storing data and logic gates configured to perform a logical AND function of the input signal IN and the data signal D (using the inverted data signal DB), in accordance with some embodiments.

FIG. 4 is a diagram schematically illustrating an NVM SRAM CIM cell 200 that includes an RRAM 202 for storing data and logic gates 204 and 206 configured to perform a logical AND function of the input signal IN and the data signal D (using the inverted data signal DB), in accordance with some embodiments. The NVM SRAM CIM cell 200 is like the NVM SRAM CIM cell 130, except the NVM 134 has been specified to be an RRAM 202 and the logic gates 136 have been specified to be an inverter 204 and a nor gate 206 configured to perform a logical AND function of the input signal IN and the data signal D (using the inverted data signal DB).

Each of the NVM SRAM CIM cells 130 and 200 includes the six transistor SRAM 132 described in relation to FIG. 3, such that the description of the SRAM 132 including first PMOS transistor 152, first NMOS transistor 154, second PMOS transistor 156, second NMOS transistor 158, first access control NMOS transistor 164, and second access control NMOS transistor 166 with connections to the bit line BL 140, the bit line bar BLB 142, the first word line WL 144, the second word line WLB 146, the first power supply voltage VDD1 148, and the second power supply voltage VDD2 150 will not be repeated here.

The RRAM 202 is electrically connected on one side to a drain/source region of the first access control NMOS transistor 164 and on another side to a drain/source region of the first PMOS transistor 152, a drain/source region of the first NMOS transistor 154, and the gates of the second PMOS transistor 156 and the second NMOS transistor 158.

The input of the inverter 204 is configured to receive the input signal IN at the input 170 and the output of the inverter 204 is electrically connected to one input of the nor gate 206. The other input of the nor gate 206 is connected to the drain/source region of the second access control NMOS transistor 166, the drain/source region of the second PMOS transistor 156, the drain/source region of the second NMOS transistor 158, and the gates of the first PMOS transistor 152 and the first NMOS transistor 154 to receive the inverted data signal DB. In this configuration, the inverter 204 and nor gate 206 perform a logical AND function of the input signal IN and the data signal D (using the inverted data signal DB) to provide the CIM output OUT at the output 172.

Figure 5:
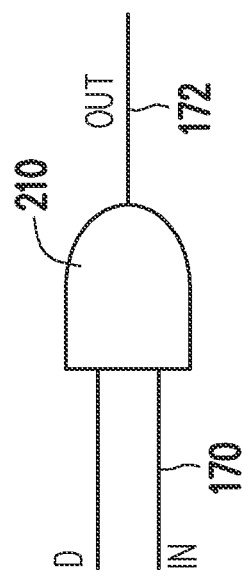
FIG. 5 is a diagram schematically illustrating an and gate configured to provide a logical AND function of the input signal IN and the data signal D, in accordance with some embodiments.
Figure 6:
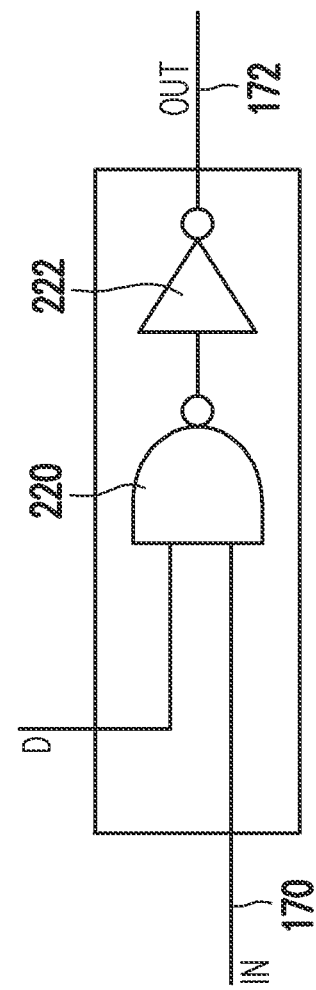
FIG. 6 is a diagram schematically illustrating a nand gate and an inverter configured to provide a logical AND function of the input signal IN and the data signal D, in accordance with some embodiments.

FIGS. 5 and 6 are diagrams schematically illustrating other logic gate configurations that provide a logical AND function of the input signal IN and the data signal D, in accordance with some embodiments.

FIG. 5 is a diagram schematically illustrating an and gate 210 configured to provide a logical AND function of the input signal IN and the data signal D, in accordance with some embodiments. The and gate 210 can be used in a memory cell, such as the memory cell 24 (shown in FIG. 1), the NVM SRAM CIM cell 100 of FIG. 2, and the NVM SRAM CIM cell 130 of FIG. 3. In some embodiments, the and gate 210 can be used to replace the inverter 204 and nor gate 206 of the NVM SRAM CIM cell 200 of FIG. 4 to provide the logical AND function of the input signal IN and the data signal D.

One input of the and gate 210 is electrically connected to one side of the NVM (such as NVM 104, NVM 134, and RRAM 202), a drain/source region of the first PMOS transistor 152, a drain/source region of the first NMOS transistor 154, and the gates of the second PMOS transistor 156 and the second NMOS transistor 158 to receive the data signal D. The other input of the and gate 210 is electrically connected to receive the input signal IN at the input 170. In this configuration, the and gate 210 is configured to perform a logical AND function of the input signal IN and the data signal D and provide the CIM output OUT at the output 172.

FIG. 6 is a diagram schematically illustrating a nand gate 220 and an inverter 222 configured to provide a logical AND function of the input signal IN and the data signal D, in accordance with some embodiments. The nand gate 220 and the inverter 222 can be used in a memory cell, such as the memory cell 24 (shown in FIG. 1), the NVM SRAM CIM cell 100 of FIG. 2, and the NVM SRAM CIM cell 130 of FIG. 3. In some embodiments, the nand gate 220 and the inverter 222 can be used to replace the inverter 204 and nor gate 206 of the NVM SRAM CIM cell 200 of FIG. 4 to provide the logical AND function of the input signal IN and the data signal D.

One input of the nand gate 220 is electrically connected to one side of the NVM (such as NVM 104, NVM 134, and RRAM 202), a drain/source region of the first PMOS transistor 152, a drain/source region of the first NMOS transistor 154, and the gates of the second PMOS transistor 156 and the second NMOS transistor 158 to receive the data signal D. The other input of the nand gate 220 is electrically connected to receive the input signal IN at the input 170. The output of the nand gate 220 is electrically connected to the input of the inverter 222 and the output of the inverter is output 172. In this configuration, the nand gate 220 and the inverter 222 are configured to perform a logical AND function of the input signal IN and the data signal D and provide the CIM output OUT at the output 172.

Figure 7:
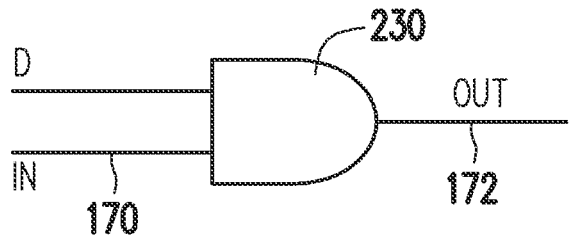
FIG. 7 is a diagram schematically illustrating an or gate configured to provide a logical OR function of the input signal IN and the data signal D, in accordance with some embodiments.
Figure 8:
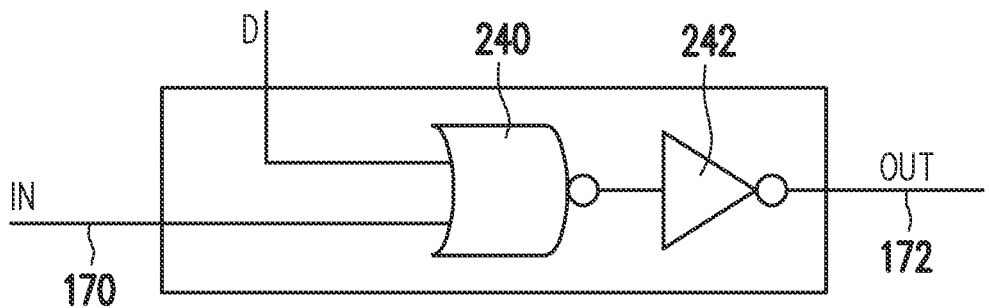
FIG. 8 is a diagram schematically illustrating a nor gate and an inverter configured to provide a logical OR function of the input signal IN and the data signal D, in accordance with some embodiments.
Figure 9:
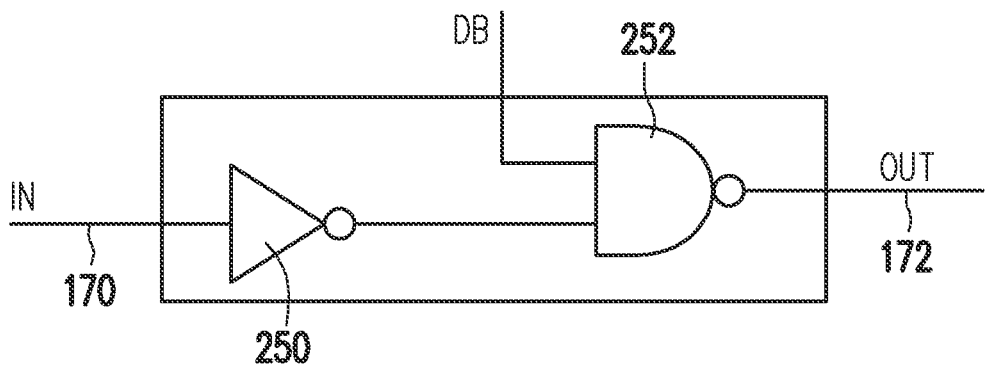
FIG. 9 is a diagram schematically illustrating an inverter and a nand gate configured to provide a logical OR function of the input signal IN and the data signal D (using the inverted data signal DB), in accordance with some embodiments.

FIGS. 7-9 are diagrams schematically illustrating logic gate configurations that provide a logical OR function of the input signal IN and the data signal D, in accordance with some embodiments.

FIG. 7 is a diagram schematically illustrating an or gate 230 configured to provide a logical OR function of the input signal IN and the data signal D, in accordance with some embodiments. The or gate 230 can be used in a memory cell, such as the memory cell 24 (shown in FIG. 1), the NVM SRAM CIM cell 100 of FIG. 2, and the NVM SRAM CIM cell 130 of FIG. 3. In some embodiments, the or gate 230 can be used to replace the inverter 204 and nor gate 206 of the NVM SRAM CIM cell 200 of FIG. 4 and provide a logical OR function of the input signal IN and the data signal D.

One input of the or gate 230 is electrically connected to one side of the NVM (such as NVM 104, NVM 134, and RRAM 202), a drain/source region of the first PMOS transistor 152, a drain/source region of the first NMOS transistor 154, and the gates of the second PMOS transistor 156 and the second NMOS transistor 158 to receive the data signal D. The other input of the or gate 230 is electrically connected to receive the input signal IN at the input 170. In this configuration, the or gate 230 is configured to perform a logical OR function of the input signal IN and the data signal D and provide the CIM output OUT at the output 172.

FIG. 8 is a diagram schematically illustrating a nor gate 240 and an inverter 242 configured to provide a logical OR function of the input signal IN and the data signal D, in accordance with some embodiments. The nor gate 240 and the inverter 242 can be used in a memory cell, such as the memory cell 24 (shown in FIG. 1), the NVM SRAM CIM cell 100 of FIG. 2, and the NVM SRAM CIM cell 130 of FIG. 3. In some embodiments, the nor gate 240 and the inverter 242 can be used to replace the inverter 204 and nor gate 206 of the NVM SRAM CIM cell 200 of FIG. 4 and provide a logical OR function of the input signal IN and the data signal D.

One input of the nor gate 240 is electrically connected to one side of the NVM (such as NVM 104, NVM 134, and RRAM 202), a drain/source region of the first PMOS transistor 152, a drain/source region of the first NMOS transistor 154, and the gates of the second PMOS transistor 156 and the second NMOS transistor 158 to receive the data signal D. The other input of the nor gate 240 is electrically connected to receive the input signal IN at the input 170. The output of the nor gate 240 is electrically connected to the input of the inverter 242 and the output of the inverter 242 is output 172. In this configuration, the nor gate 240 and the inverter 242 are configured to perform a logical OR function of the input signal IN and the data signal D and provide the CIM output OUT at the output 172.

FIG. 9 is a diagram schematically illustrating an inverter 250 and a nand gate 252 configured to provide a logical OR function of the input signal IN and the data signal D (using the inverted data signal DB), in accordance with some embodiments. The inverter 250 and the nand gate 252 can be used in a memory cell, such as the memory cell 24 (shown in FIG. 1), the NVM SRAM CIM cell 100 of FIG. 2, and the NVM SRAM CIM cell 130 of FIG. 3. In some embodiments, the inverter 250 and the nand gate 252 can be used to replace the inverter 204 and nor gate 206 of the NVM SRAM CIM cell 200 of FIG. 4 and provide a logical OR function of the input signal IN and the data signal D (using the inverted data signal DB).

The input of the inverter 250 is configured to receive the input signal IN at the input 170 and the output of the inverter 250 is electrically connected to one input of the nand gate 252. The other input of the nand gate 252 is connected to the drain/source region of the second access control NMOS transistor 166, the drain/source region of the second PMOS transistor 156, the drain/source region of the second NMOS transistor 158, and the gates of the first PMOS transistor 152 and the first NMOS transistor 154 to receive the inverted data signal DB. In this configuration, the inverter 250 and the nand gate 252 perform a logical OR function of the input signal IN and the data signal D (using the inverted data signal DB) to provide the CIM output OUT at the output 172.

FIGS. 4-9 include CIM logic gates for performing a logical AND function or a logical OR function. In other embodiments, the CIM logic gates, such as the CIM logic gates 106 (shown in FIG. 2) and the CIM logic gates 136 (shown in FIG. 3), can be configured to perform one or more logic functions including AND, OR, NOT, NAND, NOR, XOR, XNOR, and/or Buffer functions.

As noted above, each of the memory cells 24 and each of the NVM SRAM CIM cells 100, 130, and 200 is configured to operate in three modes, including the SRAM mode, the NVM mode, and the CIM mode. In the CIM mode, the logic gates, such as the CIM logic gates 106 (shown in FIG. 2) and the CIM logic gates 136 (shown in FIG. 3), receive an input signal IN at the input 170 and data from the SRAM 132 to determine a CIM output OUT that is provided at the output 172. In some embodiments, the data from the SRAM 132 is a weight that is used in a convolutional neural network (CNN).

FIG. 10 is a diagram schematically illustrating two example truth tables 260 for the CIM logic gates operating in the CIM mode, in accordance with some embodiments. The truth tables 260 include a logical AND function truth table 262 and a logical OR function truth table 264. Of course, other truth tables can be developed for other logic functions performed by logic gates.

The logical AND function truth table 262 and the logical OR function truth table 264 each include columns for the input signal IN, the data signal D, and the output signal OUT. The input signal IN and the data signal D include the four binary combinations of 00, 01, 10, and 11. Also, in the CIM mode, the bit line BL, bit line bar BLB, first word line WL, and second word line WLB are all set to 0 volts (V).

The logical AND function output signal OUT is 0 if either the input signal IN is 0 or the data signal D is 0 (the inverted data signal DB is 1) or both the input signal IN is 0 and the data signal D is 0 (the inverted data signal DB is 1). The logical AND function output signal OUT is 1 only if both the input signal IN is 1 and the data signal D is 1 (the inverted data signal DB is 0).

The logical OR function output signal OUT is 1 if the input signal IN is 1 or the data signal D is 1 (the inverted data signal DB is 0) or both the input signal IN is 1 and the data signal D is 1 (the inverted data signal DB is 0). The logical OR function output signal OUT is 0 only if both the input signal IN is 0 and the data signal D is 0 (the inverted data signal DB is 1).

Thus, in the CIM mode, the logic gates receive an input signal IN at the input 170 and data from the SRAM 132 and determine a CIM output OUT that is provided at the output 172. Also, each of the memory cells 24 and each of the NVM SRAM CIM cells 100, 130, and 200 can be operated in the SRAM mode and the NVM mode. In the SRAM mode, data is read from and written into the SRAM, such as the SRAM 102 and the SRAM 132, in the NVM SRAM CIM cell, such as each of the memory cells 24 (shown in FIG. 1), the NVM SRAM CIM cell 100 of FIG. 2, the NVM SRAM CIM cell 130 of FIG. 3, and the NVM SRAM CIM cell 200 of FIG. 4.

FIG. 11 is a diagram schematically illustrating a table 300 depicting a read operation of the SRAM 132 in one of the NVM SRAM CIM cells operating in the SRAM mode, in accordance with some embodiments. In the SRAM mode, data can be read from and written into the SRAM 132, bypassing the NVM, such as NVM 104, NVM 134, and RRAM 202.

In the read operation of the SRAM 132, bit line BL 140 and bit line bar BLB 142 are pre-charged to a high voltage level 1, such as VDD. Then, first word line WL 144 and second word line WLB 146 are set to a high voltage level 1 to bias on the first access control NMOS transistor 164 and the second access control NMOS transistor 166. This discharges the bit line BL 140 or the bit line bar BLB 142 through the SRAM 132 and develops a voltage difference between the bit line BL 140 and the bit line bar BLB 142 that can be read by a sensing circuit.

The table 300 depicts reading a 0 302 and reading a 1 304. In reading a 0 302, the bit line BL 140 and the bit line bar BLB 142 are pre-charged to a high voltage level 1. Then, the first word line WL 144 and the second word line WLB 146 are set to a high voltage level 1, which biases on the first access control NMOS transistor 164 and the second access control NMOS transistor 166. With the data signal D at a low voltage level 0 and the inverted data signal DB at a high voltage level 1, the bit line BL 140 is discharged through the first access control NMOS transistor 164, the NVM, and the first NMOS transistor 154 to a low voltage level 0, and the bit line bar BLB 142 remains at the high voltage level 1. The voltage difference between the bit line BL 140 at the low voltage level 0 and the bit line bar BLB 142 at the high voltage level 1 is read by a sensing circuit.

In reading a 1 304, the bit line BL 140 and the bit line bar BLB 142 are pre-charged to a high voltage level 1. Then, the first word line WL 144 and the second word line WLB 146 are set to a high voltage level 1, which biases on the first access control NMOS transistor 164 and the second access control NMOS transistor 166. With the data signal D at a high voltage level 1 and the inverted data signal DB at a low voltage level 0, the bit line BL 140 remains at the high voltage level 1 and the bit line bar BLB 142 is discharged through the second access control NMOS transistor 166 and the second NMOS transistor 158 to a low voltage level 0. The voltage difference between the bit line BL 140 at the high voltage level 1 and the bit line bar BLB 142 at the low voltage level 0 is read by the sensing circuit.

FIG. 12 is a diagram schematically illustrating a table 310 depicting a write operation of the SRAM 132 in one of the NVM SRAM CIM cells operating in the SRAM mode, in accordance with some embodiments.

In the write operation of the SRAM 132, one of the bit line BL 140 and the bit line bar BLB 142 is discharged to a low voltage level 0, such as ground, and the other one of the bit line BL 140 and the bit line bar BLB 142 is set to a high voltage level 1, such as VDD. Then, the first word line WL 144 and the second word line WLB 146 are set to a high voltage level 1 to bias on the first access control NMOS transistor 164 and the second access control NMOS transistor 166. This discharges the corresponding one of the data signal D and the inverted data signal DB to a low voltage level 0 and sets or charges the other one of the data signal D and the inverted data signal DB to the high voltage level 1, writing the data into the SRAM 132.

The table 310 depicts writing a 0 312 into the SRAM 132, where the data signal D of the SRAM 132 is set to a 0, and writing a 1 314 into the SRAM 132, where the data signal D of the SRAM 132 is set to a 1. In writing a 0 312, the bit line BL 140 is discharged to a low voltage level 0, such as ground, and the bit line bar BLB 142 is set to a high voltage level 1, such as VDD. Then, the first word line WL 144 and the second word line WLB 146 are set to a high voltage level 1 to bias on the first access control NMOS transistor 164 and the second access control NMOS transistor 166. This discharges the data signal D to a low voltage level 0 through the first access control NMOS transistor 164 and sets or charges the inverted data signal DB to the high voltage level 1 through the second access control NMOS transistor 166, writing a 0 into the SRAM 132.

In writing a 1 314, the bit line BL 140 is set or charged to a high voltage level 1, such as VDD, and the bit line bar BLB 142 is discharged to a low voltage level 0, such as ground. Then, the first word line WL 144 and the second word line WLB 146 are set to a high voltage level 1 to bias on the first access control NMOS transistor 164 and the second access control NMOS transistor 166. This sets or charges the data signal D to the high voltage level 1 through the first access control NMOS transistor 164 and discharges the inverted data signal DB to the low voltage level 0 through the second access control NMOS transistor 166, writing a 1 into the SRAM 132.

Thus, in the SRAM mode, data is read from and written into the SRAM, such as the SRAM 102 and the SRAM 132, in the NVM SRAM CIM cell, such as each of the memory cells 24 (shown in FIG. 1), the NVM SRAM CIM cell 100 of FIG. 2, the NVM SRAM CIM cell 130 of FIG. 3, and the NVM SRAM CIM cell 200 of FIG. 4.

Each of the memory cells 24 and each of the NVM SRAM CIM cells 100, 130, and 200 also operates in the NVM mode. In the NVM mode, data is stored into the NVM, such as the RRAM 202 (shown in FIG. 4), during write operations including a set operation (write logic 1) and a reset operation (write logic 0) and data is recalled in a recall operation using the SRAM 132.

FIG. 13 is a diagram schematically illustrating a table 320 depicting the write operations including the set operation (write logic 1) 322 and the reset operation (write logic 0) 322 324 for the RRAM 202, in accordance with some embodiments.

In the set operation (write logic 1) 322 of the RRAM 202, the bit line BL 140 and the bit line bar BLB 142 are discharged to low voltage levels. In some embodiments, the bit line BL 140 and the bit line bar BLB 142 are discharged to low voltage levels 0, such as ground. In some embodiments, the bit line BL 140 and the bit line bar BLB 142 are discharged to low voltage levels, such as about 0.8 V or 0.9 V.

In the set operation (write logic 1), the first power supply voltage VDD1 148 is adjusted to a set voltage VSET that is a high voltage level, such as 2 V, and the second power supply voltage VDD2 150 is adjusted to a power supply voltage, such as about 0.9 V. Then the first word line WL 144 is adjusted to a high word line voltage VWWL, such as 2 V, and the second word line WBL 146 is adjusted to a power voltage level PWR, such as 1.2 V. This biases on the first access control NMOS transistor 164 and the second access control NMOS transistor 166. The inverted data signal DB is pulled to a low voltage level, such as 0.2 V to 0.3 V, which biases on the first PMOS transistor 152 and the data signal D is pulled to a high voltage level, such as 1.8 V, which biases on the second NMOS transistor 158. The RRAM 202 conducts current from the high voltage level data signal D, through the RRAM 202, and to the bit line data signal BLD and the low voltage level on the bit line BL 140, which sets the RRAM 202 into a low resistance state that is the logic 1 state.

In the reset operation (write logic 0) 324 of the RRAM 202, the bit line BL 140 is charged to a reset voltage VRESET that is a high voltage level, such as 1.6 V, and the bit line bar BLB 142 is charged to a high voltage level VDD, such as 0.9 V. The first power supply voltage VDD1 148 and the second power supply voltage VDD2 150 are adjusted to a power supply voltage, such as about 0.9 V. Then the first word line WL 144 is adjusted to a high word line voltage VWWL, such as 2 V, and the second word line WBL 146 is adjusted to a power voltage level PWR, such as 1.2 V. This biases on the first access control NMOS transistor 164 and the second access control NMOS transistor 166. The inverted data signal DB goes to a higher voltage level, which biases on the first NMOS transistor 154, and the data signal D goes to a lower voltage level, which biases on the second PMOS transistor 156. The RRAM 202 conducts current from the high voltage level bit line BL 140 to the lower voltage level data signal D, which resets the RRAM 202 into a high resistance state that is the logic 0 state.

FIG. 14 is a diagram schematically illustrating a table 330 depicting a recall operation of stored data from the RRAM 202, in accordance with some embodiments. The recall operation of the RRAM 202 includes an initialization step 332 and a recall step 334.

In the initialization step 332, the data signal D is written to a low voltage level 0 and the inverted data signal DB is written to a high voltage level 1. The bit line BL 140 is discharged to a low voltage level, such as ground, and the bit line bar BLB 142 is charged to a high voltage level, such as 0.9 V. Next the first word line WL 144 and the second word line WLB 146 are adjusted to a high voltage level VDD, such as 1.2 V, which biases on the first access control NMOS transistor 164 and the second access control NMOS transistor 166. The data signal D is set to a low voltage level 0 and the inverted data signal DB is set to a high voltage level 1.

In the recall step 334, the bit line BL 140 is charged to a high voltage level VDD, such as 0.9 V, and the bit line bar BLB 142 is discharged to a low voltage level, such as ground. Then, the first word line WL 144 is adjusted to a high voltage level, such as 1.2 V, and the second word line WLB 146 is adjusted to a low voltage level, such as ground. This biases on the first access control NMOS transistor 164 and biases off the second access control NMOS transistor 166. If the RRAM 202 is set to a low resistance state (a logic 1 state), the data signal D is pulled to a high voltage level by the high voltage level bit line BL 140 through the first access control NMOS transistor 164 and the low resistance state RRAM 202 to recall a data 1. If the RRAM 202 is reset to a high resistance state (a logic 0 state), the data signal D remains at the low voltage level 0 and the inverted data signal DB remains at the high voltage level. In some embodiments, in the recall step 334, the bit line bar BLB 142 is charged to a high voltage level VDD, such as 0.9 V.

Figure 15:
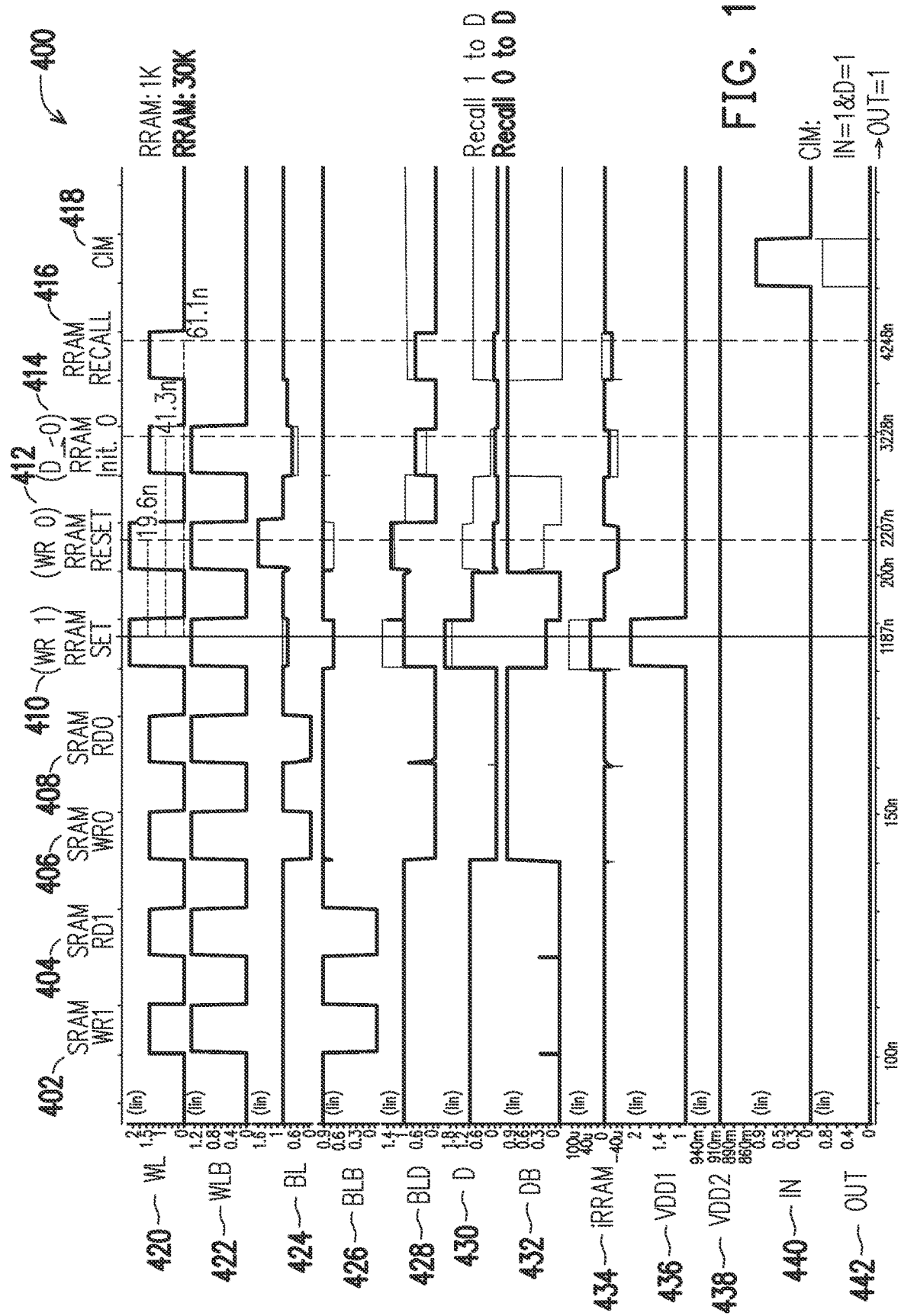
FIG. 15 is a diagram schematically illustrating a timing diagram of the three modes of operation of the NVM SRAM CIM cell of FIG. 4, in accordance with some embodiments.

FIG. 15 is a diagram schematically illustrating a timing diagram 400 of the three modes of operation of the NVM SRAM CIM cell 200 of FIG. 4, in accordance with some embodiments. The NVM SRAM CIM cell 200 includes the RRAM 202 and the inverter 204 and nor gate 206 logic gates that perform a logical AND function of the input signal IN and the data signal D (using the inverted data signal DB).

The three modes of operation of the NVM SRAM CIM cell 200 include the SRAM mode, the NVM mode, and the CIM mode. The SRAM mode operations include the first four columns of the timing diagram 400 including the SRAM write 1 column 402, the SRAM read 1 column 404, the SRAM write 0 column 406, and the SRAM read 0 column 408. The NVM mode operations includes the next four columns of the RRAM SET column 410, the RRAM RESET column 412, and the RRAM recall columns of the RRAM initialization column 414, and the RRAM recall column 416. The CIM mode operations include the CIM column 418.

The timing diagram 400 includes rows for twelve different signals including the first word line WL 144 row 420, the second word line WLB 146 row 422, the bit line BL 140 row 424, the bit line bar BLB 142 row 426, the bit line data signal BLD (on one side of the RRAM 202) row 428, the data signal D (on the other side of the RRAM 202) row 430, the inverted data signal DB row 432, the current running through the RRAM 202 row 434, the first power supply voltage VDD1 148 row 436, the second power supply voltage VDD2 150 row 438, the input signal IN at input 170 row 440, and the output signal OUT at output 172 row 442.

In the timing diagram 400, the low resistance state of the RRAM 202 is the logic 1 state, and the high resistance state of the RRAM 202 is the logic 0 state. In this example, the low resistance state of the RRAM 202 is a resistance of 1000 ohms and the high resistance state of the RRAM 202 is a resistance of 30,000 ohms.

In writing a logic 1 into the SRAM 132, as illustrated in the SRAM write 1 column 402, the first power supply voltage VDD1 148 and the second power supply VDD2 150 are set to a high voltage level, such as 0.9 V. The bit line BL 140 is set or charged to a high voltage level 1, such as 0.9 V, and the bit line bar BLB 142 is discharged to a low voltage level 0, such as ground. Then, the first word line WL 144 and the second word line WLB 146 are set to a high voltage level 1, such as 1.2 V, to bias on the first access control NMOS transistor 164 and the second access control NMOS transistor 166. This sets or charges the data signal D to the high voltage level 1, such as 0.9 V, through the first access control NMOS transistor 164 and the RRAM 202 with very little current iRRAM flowing through the RRAM 202 and discharges the inverted data signal DB to the low voltage level 0, such as ground, through the second access control NMOS transistor 166, writing a 1 into the SRAM 132.

In reading a logic 1 from the SRAM 132, as illustrated in the SRAM read 1 column 404, the first power supply voltage VDD1 148 and the second power supply VDD2 150 are set to a high voltage level, such as 0.9 V. The bit line BL 140 and the bit line bar BLB 142 are pre-charged to a high voltage level 1, such as 0.9 V, and then the first word line WL 144 and the second word line WLB 146 are set to a high voltage level 1, such as 1.2 V, which biases on the first access control NMOS transistor 164 and the second access control NMOS transistor 166. If the data signal D is at a high voltage level 1, such as 0.9 V, and the inverted data signal DB is at a low voltage level 0, such as ground (0 V), the bit line BL 140 remains at the high voltage level 1, such as 0.9 V, with little or no current iRRAM flowing through the RRAM 202, and the bit line bar BLB 142 is discharged through the second access control NMOS transistor 166 and the second NMOS transistor 158 to a low voltage level 0, such as ground. The voltage difference between the bit line BL 140 at the high voltage level 1, such as 0.9 V, and the bit line bar BLB 142 at the low voltage level 0, such as ground, is read by a sensing circuit.

In writing a logic 0 into the SRAM 132, as illustrated in the SRAM write 0 column 406, the first power supply voltage VDD1 148 and the second power supply VDD2 150 are set to a high voltage level, such as 0.9 V. The bit line BL 140 is discharged to a low voltage level 0, such as ground, and the bit line bar BLB 142 is set to a high voltage level 1, such as 0.9 V. Then, the first word line WL 144 and the second word line WLB 146 are set to a high voltage level 1, such as 0.9 V, to bias on the first access control NMOS transistor 164 and the second access control NMOS transistor 166. This discharges the bit line data signal BLD and the data signal D to a low voltage level 0, such as ground, through the first access control NMOS transistor 164 and the RRAM 202 with current iRRAM flowing through RRAM 202 and sets or charges the inverted data signal DB to the high voltage level 1, such as 0.9 V, through the second access control NMOS transistor 166, writing a 0 into the SRAM 132.

In reading a logic 0 from the SRAM 132, as illustrated in the SRAM read 0 column 408, the first power supply voltage VDD1 148 and the second power supply VDD2 150 are set to a high voltage level, such as 0.9 V. The bit line BL 140 and the bit line bar BLB 142 are pre-charged to a high voltage level 1, such as 0.9 V, and the first word line WL 144 and the second word line WLB 146 are set to a high voltage level 1, such as 1.2 V, which biases on the first access control NMOS transistor 164 and the second access control NMOS transistor 166. If the data signal D is at a low voltage level 0, such as ground, and the inverted data signal DB is at a high voltage level 1, such as 0.9 V, the bit line BL 140 is discharged through the first access control NMOS transistor 164, the RRAM 202 (with current iRRAM flowing through RRAM 202), and the first NMOS transistor 154 to a low voltage level 0, such as ground, and the bit line bar BLB 142 remains at the high voltage level 1, such as 0.9 V. The voltage difference between the bit line BL 140 at the low voltage level 0, such as ground, and the bit line bar BLB 142 at the high voltage level 1, such as 0.9 V, is read by a sensing circuit.

As previously noted, the NVM mode operations includes the next four columns of the RRAM SET column 410, the RRAM RESET column 412, the RRAM initialization column 414, and the RRAM recall column 416.

In a set operation (write logic 1) of the RRAM 202, as illustrated in the RRAM SET column 410, the bit line BL 140 and the bit line bar BLB 142 settle to voltage levels such as about 0.8 V or 0.9 V. The first power supply voltage VDD1 148 is adjusted to a set voltage VSET that is a high voltage level, such as 2 V, and the second power supply voltage VDD2 150 is adjusted to a power supply voltage, such as about 0.9 V. Then the first word line WL 144 is adjusted to a high word line voltage VWWL, such as 2 V, and the second word line WBL 146 is adjusted to a power voltage level PWR, such as 1.2 V. This biases on the first access control NMOS transistor 164 and the second access control NMOS transistor 166. The inverted data signal DB is pulled to a low voltage level, such as 0.2 V to 0.3 V, which biases on the first PMOS transistor 152 and the data signal D is pulled to a high voltage level, such as 1.8 V with the RRAM 202 in a high resistance state and such as 1.6 V with the RRAM 202 in a low resistance state, which biases on the second NMOS transistor 158. The RRAM 202 conducts current iRRAM of about 40 microamps (uA) with the RRAM 202 in the high resistance state and about 100 uA with the RRAM 202 in the low resistance state, and the bit line data signal BLD is set to about 0.9 V with the RRAM 202 in the high resistance state and about 1.4 V with the RRAM 202 in the low resistance state. The RRAM 202 conducts current iRRAM from the high voltage level data signal D, through the RRAM 202, and to the bit line data signal BLD and the low voltage level on the bit line BL 140, which sets the RRAM 202 into the low resistance state that is the logic 1 state.

In a reset operation (write logic 0) of the RRAM 202, as illustrated in the RRAM RESET column 412, the first power supply voltage VDD1 148 and the second power supply VDD2 150 are set to a high voltage level, such as 0.9 V. The bit line BL 140 is charged to a reset voltage VRESET that is a high voltage level, such as 1.6 V, and the bit line bar BLB 142 is charged to a high voltage level 1, such as 0.7 V with the RRAM 202 in the low resistance state and 0.9 V with the RRAM 202 in the high resistance state. The first power supply voltage VDD1 148 and the second power supply voltage VDD2 150 are adjusted to a power supply voltage, such as about 0.9 V. Then the first word line WL 144 is adjusted to a high word line voltage VWWL, such as 2 V, and the second word line WBL 146 is adjusted to a power voltage level PWR, such as 1.2 V. This biases on the first access control NMOS transistor 164 and the second access control NMOS transistor 166. The inverted data signal DB goes to a higher voltage level, such as 0.3 V with the RRAM 202 in the low resistance state to 0.9 V with the RRAM 202 in the high resistance state, which biases on the first NMOS transistor 154. The data signal D goes to a lower voltage level, such as from 1.4 V with the RRAM 202 in the low resistance state to 0.3 V with the RRAM 202 in the high resistance state, which biases on the second PMOS transistor 156. The RRAM 202 conducts current iRRAM of about −40 microamps (uA) and the bit line data signal BLD is set to about 1.3 V. The RRAM 202 conducts current iRRAM from the high voltage level bit line BL 140 to the lower voltage level data signal D, which resets the RRAM 202 into the high resistance state that is the logic 0 state.

The recall mode operation for retrieving stored data from the RRAM 202 includes the initialization step 332 depicted in the RRAM initialization column 414 and the recall step 334 depicted in the RRAM recall column 416.

In the initialization step 332, as illustrated in the RRAM initialization column 414, the first power supply voltage VDD1 148 and the second power supply VDD2 150 are set to a high voltage level, such as 0.9 V. The data signal D is written to a low voltage level 0, such as ground, and the inverted data signal DB is written to a high voltage level 1, such as 0.9 V. The bit line BL 140 is set to a voltage level, such as 0.6 V to 0.8 V, and the bit line bar BLB 142 is charged to a high voltage level, such as 0.9 V. Next, the first word line WL 144 and the second word line WLB 146 are adjusted to a high voltage level VDD, such as 1.2 V, which biases on the first access control NMOS transistor 164 and the second access control NMOS transistor 166. The data signal D is set to a low voltage level 0, such as ground, and the inverted data signal DB is set to a high voltage level 1, such as 0.9 V.

In the recall step 334, as illustrated in the RRAM recall column 416, the first power supply voltage VDD1 148 and the second power supply VDD2 150 are set to a high voltage level, such as 0.9 V. The bit line BL 140 is charged to a high voltage level 1, such as 0.9 V, and the bit line bar BLB 142 can be charged to a high voltage level 1, such as 0.9 V. Then, the first word line WL 144 is adjusted to a high voltage level, such as 1.2 V, and the second word line WLB 146 is adjusted to a low voltage level, such as ground. This biases on the first access control NMOS transistor 164 and biases off the second access control NMOS transistor 166. If the RRAM 202 is at a low resistance state (a logic 1 state), the data signal D is pulled to a high voltage level 1, such as 0.9 V, by the high voltage level bit line BL 140 through the first access control NMOS transistor 164 and the low resistance state RRAM 202 to recall a data 1, and the inverted data signal DB is pulled to a low voltage level, such as ground. If the RRAM 202 is at a high resistance state (a logic 0 state), the data signal D remains at the low voltage level 0, such as ground, and the inverted data signal DB remains at the high voltage level, such as 0.9 V. In some embodiments, in the recall step 334, the bit line bar BLB 142 is discharged to a low voltage level, such as ground.

The CIM mode operations of the NVM SRAM CIM cell 200 are illustrated in the CIM column 418. The first power supply voltage VDD1 148 and the second power supply VDD2 150 are set to a high voltage level, such as 0.9 V. The input of the inverter 204 is configured to receive the input signal IN at the input 170 and the output of the inverter 204 is electrically connected to one input of the nor gate 206. The other input of the nor gate 206 is connected to the inverted data signal DB of the SRAM 132. In this configuration, the inverter 204 and nor gate 206 perform a logical AND function of the input signal IN and the data signal D (using the inverted data signal DB) to provide the CIM output OUT at the output 172. In this example, the input signal IN is set to a high voltage level, such as 0.9 V, and the output signal OUT is the inverse of the inverted data signal DB, i.e., the output signal OUT follows the data signal D.

Figure 16:
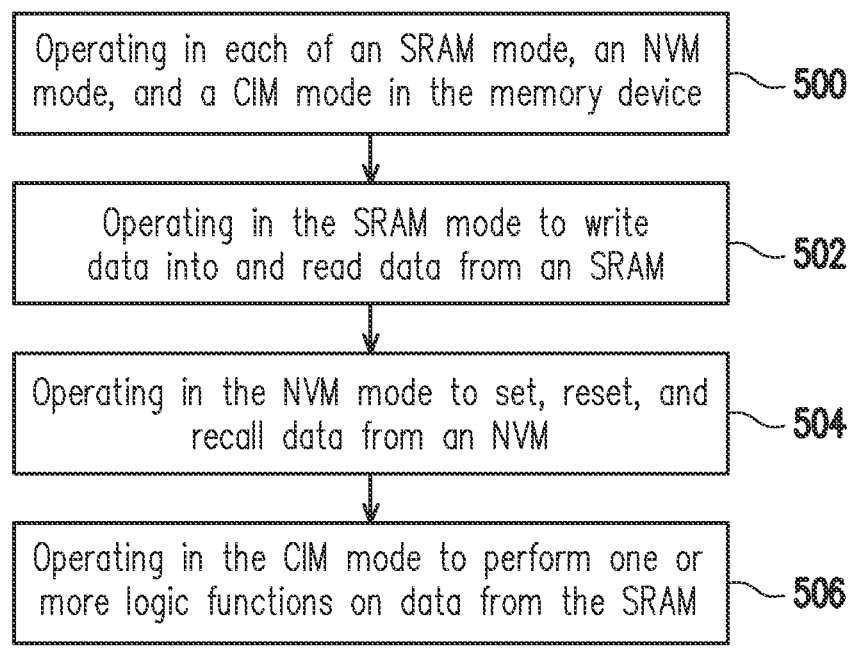
FIG. 16 is a diagram schematically illustrating a method of operation of a memory device, in accordance with some embodiments.

FIG. 16 is a diagram schematically illustrating a method of operation of a memory device, such as memory device 20, in accordance with some embodiments. At 500, the method includes operating in each of an SRAM mode, an NVM mode, and a CIM mode in the memory device.

At 502, the method includes operating in the SRAM mode to write data into and read data from an SRAM, such as the SRAM 102 and the SRAM 132. In some embodiments, operating in the SRAM mode includes pre-charging a bit line BL, such as the bit line BL 140, and a bit line bar BLB, such as the bit line bar BLB 142, to a high voltage and turning on two transistors, such as the first and second access control transistors 164 and 166, to read data from the SRAM. In some embodiments, operating in the SRAM mode includes discharging a bit line BL, such as the bit line BL 140, or a bit line bar BLB, such as the bit line bar BLB 142, to a low voltage and pre-charging the other one of the bit line BL or the bit line bar BLB to a high voltage and turning on the two transistors, such as the first and second access control transistors 164 and 166, to write data into the SRAM.

At 504, the method includes operating in the NVM mode to set, reset, and recall data from an NVM, such as the NVM 104, the NVM 134, and the RRAM 202. In some embodiments, the NVM is electrically connected to two cross-coupled inverters, such as the two cross-coupled inverters 160 and 162, and to one of two transistors, such as one of the first and second access control transistors 164 and 166, that control access to the two cross-coupled inverters in the SRAM.

In some embodiments, operating in the NVM mode includes discharging a bit line BL, such as the bit line BL 140, and a bit line bar BLB, such as the bit line bar BLB 142, to a low voltage, setting a power supply voltage, such as one of the power supply voltages VDD1 148 and VDD2 150, to a set voltage VSET, and then turning on the two transistors, such as the first and second access control transistors 164 and 166, to set the NVM to a first state, such as the low resistance state of an RRAM. In some embodiments, operating in the NVM mode includes charging one of the bit line BL, such as the bit line BL 140, and the bit line bar BLB, such as the bit line bar BLB 142, to a reset voltage VRESET, charging the other one of the bit line BL and the bit line bar BLB 142 to a high voltage, and turning on the two transistors, such as the first and second access control transistors 164 and 166, to reset the NVM to a second state, such as a high resistance state of an RRAM.

Also, in some embodiments, operating in the NVM mode includes discharging one of the bit line BL, such as the bit line BL 140, or the bit line bar BLB, such as the bit line bar BLB 142, to a low voltage, charging the other one of the bit line BL or the bit line bar BLB to a high voltage, and turning on the two transistors, such as the first and second access control transistors 164 and 166, to initialize a recall operation. Then charging the one of the bit line BL or the bit line bar BLB to a high voltage and turning on the one of the two transistors, such as the first and second access control transistors 164 and 166, to determine a state of the NVM.

At 506, the method includes operating in the CIM mode to perform one or more logic functions on data from the SRAM. The logic functions are performed on the data using logic gates, such as logic gates 106 and 136, electrically connected to the SRAM. In some embodiments, operating in the CIM mode includes receiving, at the logic gates, an input signal IN and the data from the SRAM and performing the one or more logic functions on the input signal IN and the data.

Thus, disclosed embodiments include an NVM SRAM CIM cell that includes an SRAM, such as a six transistor SRAM, an NVM that is configured to store data, and logic gates for performing CIM operations. The resulting NVM SRAM CIM cell is configured to store data in the NVM and recall data from the NVM, where storing data in the NVM, as opposed to in the SRAM or in a distant memory cell, reduces standby power for storing the data and supports retaining the data during power down, when the NVM SRAM CIM cell is powered completely off. Recalling data from the NVM reduces power consumption for acquiring the data, since the data is not transferred from a distant memory cell. Also, using data stored in the SRAM for CIM operations improves performance of the CIM logic operations, where the NVM SRAM CIM cell uses data from the SRAM for high speed CIM functions without utilizing a complicated sensing and reading scheme.

The NVM SRAM CIM cell is configured to operate in three modes including an SRAM mode, an NVM mode, and a CIM mode. In the SRAM mode, data is written into and read from the SRAM. In the NVM mode, the NVM can be set, i.e., written to a 1, reset, i.e., written to a 0, and data can be recalled from the NVM using the SRAM. In the CIM mode, logic gates receive one or more input signals and data from the SRAM to calculate a CIM output.

Also, the NVM SRAM CIM cell reduces area overhead, where the SRAM cell is combined with a back-end memory process for the NVM, such that data can be stored in the NVM without an area penalty. In some embodiments, the memory device can be made with a three-dimensional structure that reduces the area used in the integrated circuit. In some embodiments, the NVM can be replaced with a gain cell, such as a transistor.

In accordance with some embodiments, a memory device includes a static random-access memory that includes two cross-coupled inverters and an access transistor having a gate connected to a word line. The memory device further includes one or more logic gates electrically coupled to the static random-access memory, and a non-volatile memory electrically coupled to the static random-access memory and configured to store data and be read using the static random-access memory, wherein the non-volatile memory is connected on one side to the access transistor and on another side to the two cross-coupled inverters.

In accordance with further embodiments, a memory device includes a static random-access memory cell including first and second cross-coupled inverters and first and second access transistors configured to selectively connect the first and second cross-coupled inverters to first and second bit lines, a non-volatile memory electrically connected in series between the first inverter and the first access transistor, and a logic circuit having a first input connected between the second inverter and the second access transistor and a second input configured to receive an external input signal.

In accordance with still further disclosed aspects, a method of operation of a memory device includes operating in each of a static random-access memory mode, a non-volatile memory mode, and a compute-in-memory mode in the memory device. The method further includes: operating in the static random-access memory mode to write data into and read data from a static random-access memory; operating in the non-volatile memory mode to set, reset, and recall data from a non-volatile memory electrically connected to two cross-coupled inverters and one of two transistors that control access to the two cross-coupled inverters in the static random-access memory; and operating in the compute-in-memory mode to perform one or more logic functions on data from the static random-access memory using logic gates electrically connected to the static random-access memory.

This disclosure outlines various embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A memory device, comprising:
a static random-access memory including:
two cross-coupled inverters having a first inverter output connected to a second inverter input, and a second inverter output connected to a first inverter input;
a first access transistor having a first drain/source region connected to a bit line or a bit line bar, a second drain/source region, and a first gate connected to a first word line; and
a second access transistor having a third drain/source region connected to another one of the bit line or the bit line bar, a fourth drain/source region, and a second gate connected to a second word line;
one or more logic gates electrically coupled to the static random-access memory; and
a non-volatile memory having a first end directly connected to the second drain/source region of the first access transistor and a second end directly connected to the first inverter output and the second inverter input and configured to store data and recall the data using the static random-access memory,
wherein to initialize a recall operation to recall the data one of the bit line and the bit line bar is at a low voltage and another one of the bit line and the bit line bar is at a high voltage and the first access transistor and the second access transistor are biased on, and to determine a state of the non-volatile memory the one of the bit line and the bit line bar is at the high voltage and one of the first access transistor and the second access transistor is biased on.

2. The memory device of claim 1, wherein the static random-access memory includes a six-transistor static random-access memory that includes four transistors that form the two cross-coupled inverters and two transistors, including the first access transistor and the second access transistor, that control access to the two cross-coupled inverters.

3. The memory device of claim 2, wherein the one or more logic gates are configured to perform a logic operation with data from the static random-access memory.

4. The memory device of claim 3, wherein the one or more logic gates are configured to receive an input signal and to perform the logic operation on the input signal and the data from the static random-access memory.

5. The memory device of claim 1, wherein the non-volatile memory includes a resistive random-access memory.

6. The memory device of claim 1, wherein the non-volatile memory includes one or more of a resistive random-access memory, a magneto-resistive random-access memory, a ferroelectric random-access memory, and/or a phase-change random-access memory.

7. The memory device of claim 1, wherein the one or more logic gates are configured to perform one or more logic functions of AND, OR, NOT, NAND, NOR, XOR, XNOR, and Buffer functions.

8. The memory device of claim 1, wherein the memory device is configured to operate in three modes including a static random-access memory mode, a non-volatile memory mode, and a compute-in-memory mode.

9. The memory device of claim 8, wherein the static random-access memory is configured to be written and read in the static random-access memory mode.

10. The memory device of claim 8, wherein the non-volatile memory is configured to be set, reset, and recalled using the static random-access memory in the non-volatile memory mode.

11. A memory device, comprising:
a static random-access memory cell including:
first and second cross-coupled inverters, the first cross-coupled inverter having a first input and a first output and the second cross-coupled inverter having a second input connected to the first output and a second output connected to the first input; and
first and second access transistors configured to selectively connect the first and second cross-coupled inverters to first and second bit lines, the first access transistor having a first drain/source region connected to the first bit line, and having a second drain/source region;
a non-volatile memory electrically connected in series between the first inverter and the first access transistor, wherein the non-volatile memory has a first end directly connected to the second drain/source region and a second end directly connected to the first output and the second input and the non-volatile memory is configured to store data and recall the data using the static random-access memory cell,
wherein to initialize a recall operation to recall the data the first bit line is at a low voltage and the second bit line is at a high voltage and the first access transistor and the second access transistors are biased on, and to determine a state of the non-volatile memory the first bit line is at the high voltage and the first access transistor is biased on; and
a logic circuit having a first input connected between the second inverter and the second access transistor and a second input configured to receive an external input signal.

12. The memory device of claim 11, comprising one or more logic gates electrically coupled to the static random-access memory, wherein the one or more logic gates are configured to perform a logic operation using data from the static random-access memory.

13. The memory device of claim 11, wherein the memory device is configured to operate in a static random-access memory mode, a non-volatile memory mode, and a compute-in-memory mode.

14. The memory device of claim 13, wherein the static random-access memory is configured to be written and read in the static random-access memory mode.

15. The memory device of claim 13, wherein the non-volatile memory is configured to be set, reset, and recalled using the static random-access memory in the non-volatile memory mode.

16. A method of operation of a memory device, the method comprising:
operating in each of a static random-access memory mode, a non-volatile memory mode, and a compute-in-memory mode in the memory device;
operating in the static random-access memory mode to write data into and read data from a static random-access memory;
operating in the non-volatile memory mode to set, reset, and recall data from a non-volatile memory electrically connected to two cross-coupled inverters and one of two transistors that control access to the two cross-coupled inverters in the static random-access memory; and operating in the compute-in-memory mode to perform one or more logic functions on data from the static random-access memory using logic gates electrically connected to the static random-access memory,
wherein operating in the non-volatile memory mode comprises:
discharging one of a bit line or a bit line bar to a low voltage and charging the other one of the bit line or the bit line bar to a high voltage and turning on the two transistors to initialize a recall operation; and
charging one of the bit line or the bit line bar to the high voltage and turning on one of the two transistors to determine a state of the non-volatile memory.

17. The method of claim 16, wherein operating in the static random-access memory mode includes:
pre-charging the bit line and the bit line bar to the high voltage and turning on the two transistors to read data from the static random-access memory; and
discharging the bit line or the bit line bar to the low voltage and turning on the two transistors to write data into the static random-access memory.

18. The method of claim 16, wherein operating in the non-volatile memory mode comprises:
discharging the bit line and the bit line bar to the low voltage and turning on the two transistors to set the non-volatile memory to a first state; and
charging the bit line and the bit line bar to the high voltage and turning on the two transistors to reset the non-volatile memory to a second state.

19. The method of claim 16, wherein operating in the compute-in-memory mode comprises:
receiving, at the logic gates, an input signal;
receiving, at the logic gates, the data from the static random-access memory; and
performing the one or more logic functions on the input signal and the data.

20. The method of claim 16, wherein operating in the non-volatile memory mode comprises:
discharging the bit line to the low voltage and charging the bit line bar to the high voltage;
biasing on the two transistors to initialize a recall operation;
charging the bit line to the high voltage; and
biasing on one of the two transistors that are connected to the bit line to determine a state of the non-volatile memory.

* * * * *